United States Patent [19]
Cox

[11] Patent Number: 5,891,517
[45] Date of Patent: Apr. 6, 1999

[54] FLUIDIZED BED WITH UNIFORM HEAT DISTRIBUTION AND MULTIPLE PORT NOZZLE

[75] Inventor: Kenneth W Cox, Leander, Tex.

[73] Assignee: Sulzer Carbomedics Inc., Austin, Tex.

[21] Appl. No.: 685,457

[22] Filed: Jul. 19, 1996

Related U.S. Application Data

[62] Division of Ser. No. 473,771, Jun. 6, 1995, Pat. No. 5,569,329.

[51] Int. Cl.⁶ .................................................. C23C 16/00
[52] U.S. Cl. ............................................ 427/213; 427/249
[58] Field of Search .................................. 118/716, 725; 219/674; 427/213, 249

[56] References Cited

U.S. PATENT DOCUMENTS

| | | | |
|---|---|---|---|
| 3,448,233 | 6/1969 | Landis | 219/674 |
| 3,977,896 | 8/1976 | Bokros et al. | 427/249 |
| 4,080,927 | 3/1978 | Brown | 118/48 |
| 4,262,039 | 4/1981 | Gyarmati et al. | 427/249 |
| 4,271,207 | 6/1981 | Loser et al. | 427/716 |
| 4,354,635 | 10/1982 | Bartnert et al. | 239/11 |
| 4,387,120 | 6/1983 | Bartnert | 427/213 |
| 4,546,012 | 10/1985 | Brooks | 427/715 |
| 4,594,270 | 6/1986 | Brooks | 427/716 |
| 4,788,394 | 11/1988 | Vanneste | 219/674 |
| 4,874,916 | 10/1989 | Burke | 219/674 |
| 5,216,215 | 6/1993 | Walker | 219/674 |
| 5,328,720 | 7/1994 | Emken et al. | 427/213 |

FOREIGN PATENT DOCUMENTS

| | | |
|---|---|---|
| 0 199 655 | 10/1986 | European Pat. Off. . |
| 0 259 825 | 3/1988 | European Pat. Off. . |
| 27 44 611 | 4/1978 | Germany . |
| 38 30 963 | 3/1989 | Germany . |
| WO93/25304 | 12/1993 | WIPO . |

*Primary Examiner*—Richard Bueker
*Attorney, Agent, or Firm*—Philip S. Lyren

[57] ABSTRACT

A fluidized bed apparatus which produces a pyrolitic carbon coating with improved wear and porosity characteristics of the coating by producing a more uniform flat temperature profile throughout a reaction chamber in the area where coating is taking place. The apparatus has heating coils surrounding a lower end of the reaction chamber placed immediately adjacent one another at tight spacing. This contrasts to previous apparatus wherein heating coils were spaced between 2 cm and 5 cm apart. The apparatus also has a multi-jet nozzle to control a flow of gases through the reaction chamber. The jets in the nozzle comprise passages which are oriented such that the length of the passages lie on a series of cones having common axes.

10 Claims, 3 Drawing Sheets

FLUIDIZED BED WITH UNIFORM HEAT DISTRIBUTION AND MULTIPLE PORT NOZZLE

This is a divisional of copending application Ser. No. 08/473,771 filed on Jun. 6, 1995 now U.S. Pat. No. 5,569,329.

BACKGROUND OF MY INVENTION

It is desirable to deposit pyrolitic carbon coatings on certain objects. For example, uranium particles can be coated with pyrolitic carbon which can form a pressure-retentive shell allowing the coated particles to be fabricated into fuel rods for use in nuclear reactors. Another important use for such coatings is for heart valves and other biomedical components because a pyrolitic carbon coating is highly biocompatible and non-reactive with blood.

Pyrolitic carbon is usually deposited on an object by thermally decomposing gaseous hydrocarbons or other carbonaceous substances in vaporous form in the presence of the object. A fluidized bed usually comprises a reaction chamber or furnace surrounded by heat tubes which raise the interior temperature of the furnace to between 1200° and 2000° centigrade. A stream of gas comprising an inert fluidizing gas and a carbonaceous substance is forced through the reaction chamber and through a bed containing both primary objects to be coated and ancillary small particles, usually of a size measured in microns. Such apparatus and improvements thereon are described in U.S. Pat. No. 3,977,896; 4,546,012 and 4,594,270, which are commonly assigned. The teachings and disclosures of these patents are incorporated herein by reference.

Gases are inserted into the reaction chamber through a nozzle. Various kinds and forms of nozzles have heretofore been proposed and used. Examples can be found in U.S. Pat. No. 4,080,927; 4,262,039; 4,271,207 and 4,387,120. In general, these patents address problems associated with achieving a uniform flow through the reaction chamber or other optimum conditions for producing a particular type or condition of carbon coating. Because of the numerous variables involved, different types and characteristics of coating can be obtained by varying conditions. There remains, therefore, a need for apparatus which produce coatings having certain optimized characteristics, selected from the range of possible characteristics. In particular, for carbon coatings for biomedical components, coatings with high-hardness, controlled silicon content and improved porosity (that is, fewer pores in the coating) are desirable for certain parts. I have invented, therefore, a fluidized bed which combines a uniform heat distribution and a multi-jet nozzle to produce a carbon coating having improved characteristics with respect to hardness, porosity and silicon content.

SUMMARY OF MY INVENTION

It is an object of my invention to provide a fluidized bed apparatus which produces a pyrolitic carbon coating with improved hardness and decreased porosity. It is also an object of my invention to produce a fluidized bed apparatus which produces a pyrolitic carbon coating with a more consistent silicon content, bed volume and control of coating thickness, thereby improving the wear characteristics of the coating. My apparatus accomplishes these objects by producing a more uniform flat temperature profile throughout a reaction chamber in the area where coating is taking place. The apparatus of my invention has heating coils surrounding a lower end of the reaction chamber placed immediately adjacent one another at tight spacing. This contrasts to previous apparatus wherein heating coils were spaced between 2 cm and 5 cm apart. I have also utilized a multi-jet nozzle to control a flow of gases through the reaction chamber. The jets in the nozzle comprise passages which are oriented such that the length of the passages lie on a series of cones having common axes.

I have found that the combination of a uniform temperature distribution and a nozzle-type injector for controlling fluidizing gases is effective to produce desired characteristics.

These and other features of my invention will be apparent from the following description taken with reference to the accompanying drawings.

DETAILED DESCRIPTION OF MY PREFERRED EMBODIMENT

Figure 1:
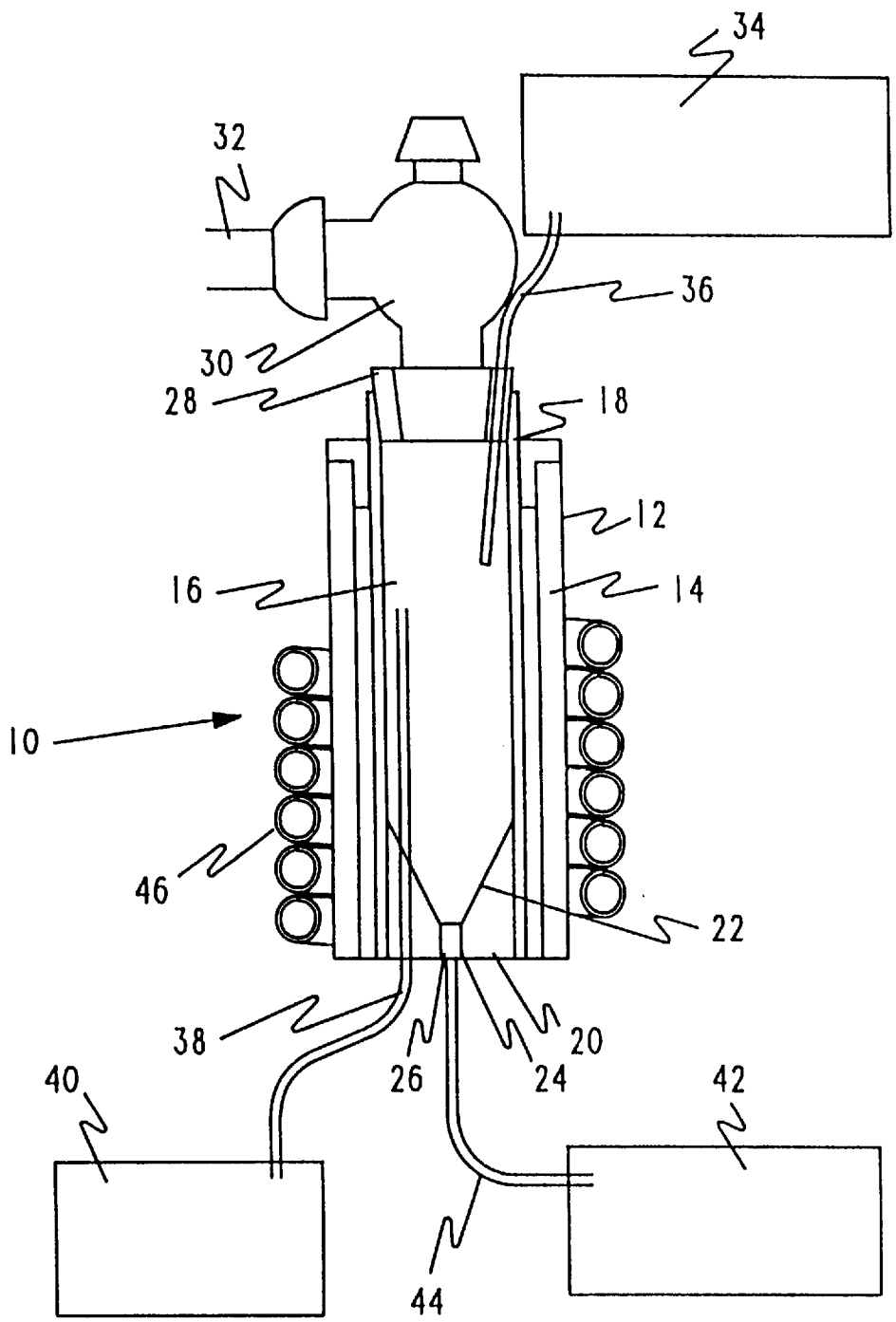
FIG. 1 is a cross-sectional view of a fluidized bed according to my invention.

Referring now to the drawing, a fluidized bed apparatus for applying a pyrolitic carbon coating to objects is generally designated 10 and illustrated in FIG. 1. The apparatus includes a furnace 12 having a cylindrical outer shell 14. The furnace shell 14 supports a reaction chamber 16 defined by a tube 18 having an insert 20 affixed thereto at its lower end. The insert 20 provides the reaction chamber 16 with a conical bottom surface 22. A central passageway 24 extends vertically upward through the insert 20, co-axial with the reaction chamber 16 and the tube 18. A nozzle 26 is inserted in the passageway 24 and a coating and fluidizing atmosphere is supplied upwardly through this nozzle 26.

The upper end of the tube 18 is fitted with a removable closure 28, mounted in any suitable manner, such as by a taper fit. The closure 28 includes a central exit passageway 30 through which the coating and fluidizing atmosphere leaves the reaction chamber. The passageway 30 communicates with an exit conduit 32 through which the gases may be routed for subsequent treatment, if desired. An injection device 34 is mounted above the closure and is designed to feed small particles into the reaction chamber at a desired rate through a tube 36. Particles are removed from the reaction chamber through a second tube 38 into a collection chamber 40. The coating and fluidizing atmosphere is supplied from a gas supply 42 through a conduit 44 to the nozzle 26. The atmosphere comprises an inert fluidizing gas, usually of helium, argon, or nitrogen, and a carbonaceous substance such as propane, methane, ethane, butane, ethylene or some other suitable substance. Further details with respect to a suitable fluidizing bed may be obtained from U.S. Pat. No. 4,546,012 or 4,594,270, the disclosure of which is incorporated herein.

Figure 5:
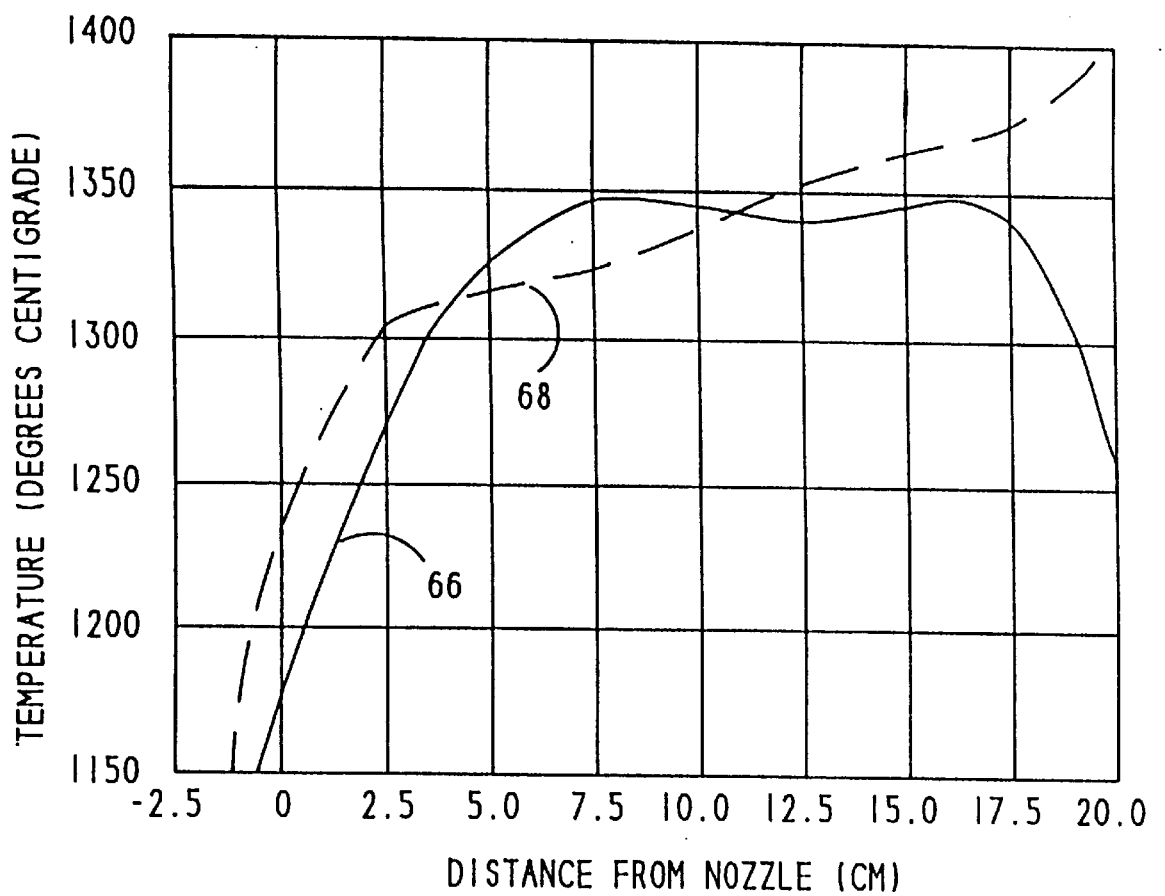
FIG. 5 is a chart of temperature vs. distance from the nozzle.

Surrounding the furnace 12 is a coiled heat tube 46. The heat tube 46 comprises one or more tubes which utilize inductive heating to raise the internal temperature in the combustion chamber 16 above 1000° C. and preferably between 1200° C. and 2000° C. In prior art fluidized bed apparatus, coils of the heating coil 46 have been spaced apart with a space between the coils of between 2 to 5 cm. I have found that the coils should be placed immediately adjacent each other, preferably with less than 1 cm of separation, more preferably with less than 0.3 cm separation, and most preferably in contact with adjacent coils. The coils are placed at the lower end of the furnace. In certain embodiments, it is common to have a view port provided into the reaction chamber. In such an instance, I have found it useful to place two turns of the heat tube 46 below the observation port and three turns above the observation port. This configuration produces means for raising and controlling the temperature within the reaction chamber in a uniform fashion. Heretofore, the temperature in the reaction chamber has generally increased linearly along the axis of the reaction chamber from bottom towards the top. I have found that by placing the coils of the heat tube adjacent each other and by compressing the tubes at the lower end of the reaction chamber, a plateau-shaped heat profile within the furnace can be produced. In other words, the temperature within the reaction chamber rises quickly above the nozzle to a relatively constant high temperature and then remains uniform at that temperature through the area occupied by the fluidized bed. Above the fluidized bed, and above the heat tubes, the temperature decreases. This phenomenon is illustrated graphically in FIG. 5. Temperature was measured on the outer surface of the chamber using an optical thermometer. Dashed line 68 represents the temperature pattern observed in a prior art fluidized bed such as disclosed in U.S. Pat. No. 4,594,270. Solid line 66 represents the temperature profile produced by my invention. I have found that this produces a pyrolitic carbon coating having improved porosity, that is, fewer pores, more consistent silicon content and bed volume, and improved thickness control.

Figures 2, 3, 4:
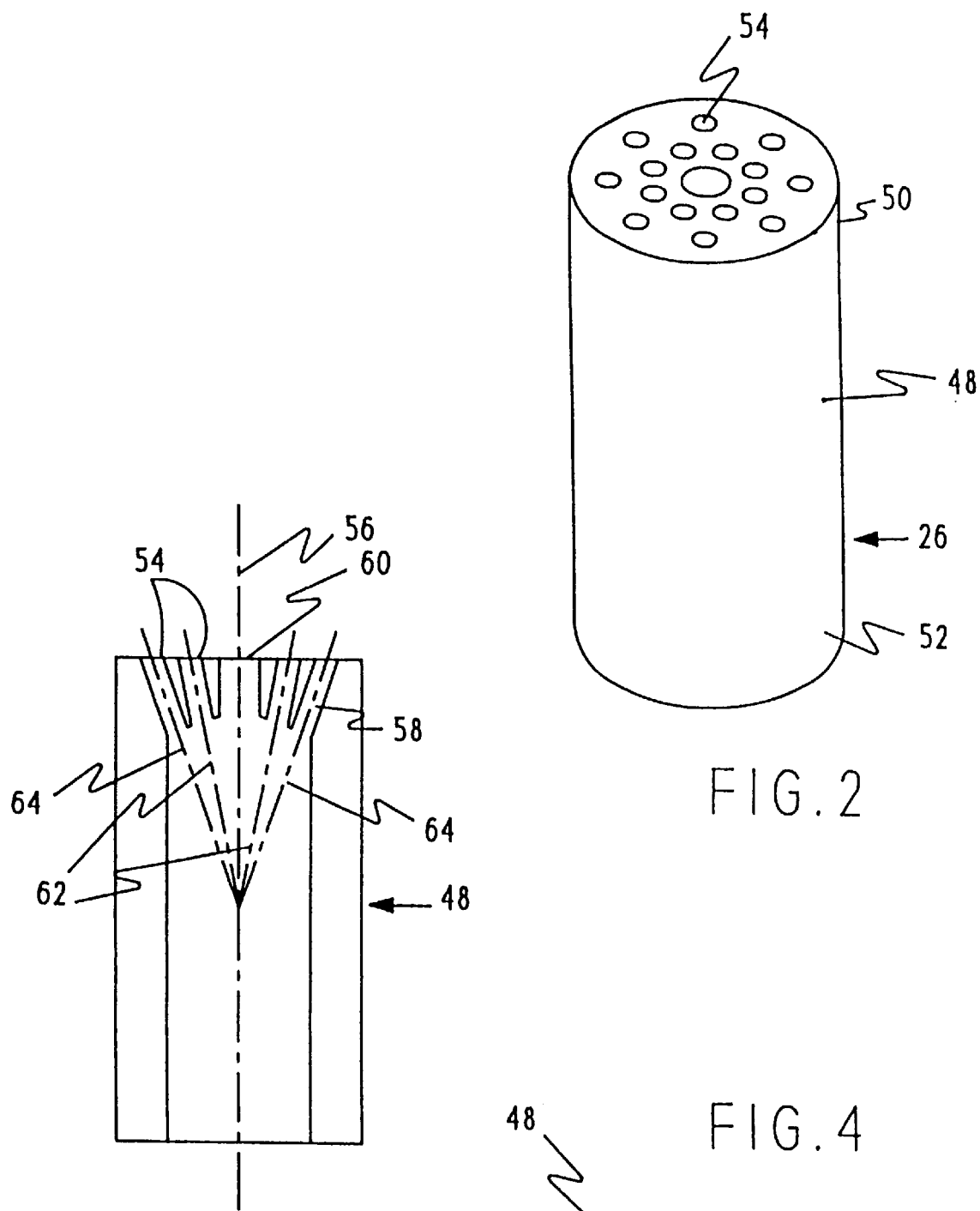
FIG. 2 is a perspective view of a nozzle for use with a fluidized bed of my invention.
FIG. 3 is a through-section view of the nozzle of FIG. 2 taken along line 3—3.
FIG. 4 is a top plan view of the nozzle of FIG. 2.

I have found that this effect is particularly enhanced through the use of a nozzle 26. My preferred embodiment for a suitable nozzle is illustrated in FIGS. 2 through 4. As seen in FIG. 2 the nozzle 26 comprises a cylinder 48 having an upper end 50 and a lower end 52. At the upper end 50 there are a plurality of jets 54. As seen in FIG. 3, the jets 54 splay outwardly from a common axis 56. In general the jets 54 have a passageway 58 which are linear and which would fall along the surface of an imaginary cone having the common axis 56. Preferably a plurality of such imaginary cones would be defined by the jets 54. Thus, in the illustrated embodiment, there is a central jet 60 along the axis 56 which would correspond to an imaginary cone with an included angle of zero, and a second set of jets 62 which would define a second imaginary cone with a non-zero angle, preferably between 15 and 30. The jets are preferably evenly spaced around the imaginary conical surface. Finally there is a third set of jets 64 which define a third cone outside the first and second cones, preferably having an angle between 20 and 40. The jets in this second set 64 are equally spaced from one another. The imaginary cones may have a common apex, as shown, but may also define different apexes along the common axis 56. Preferably, the number of jets in the second set 64 is equal to the number of jets in the first set 62, even though a greater area is available for jets as the area defined by a cone becomes larger. This tends to maintain a more uniform flow across the entire bed within the reaction chamber 16. The diameter of the central jet 60 should be between one and two times the diameter of the other jets.

Those skilled in the art will recognize that my invention may be used in other specific forms without departing from the essential characteristics and teachings thereof. The foregoing description is intended, therefore, to be illustrative and not restrictive, the scope of my invention being defined by the following claims.

I claim as my invention:

1. A process for depositing pyrolitic carbon coatings, comprising the steps of:

providing a fluidized bed reaction chamber having a central axis extending vertically through the reaction chamber, a plurality of heating tubes disposed around the reaction chamber, and a nozzle at one end of the reaction chamber, the nozzle having a central jet with a passageway aligned with the central axis and at least two other jets with passageways defining a conical shape with the central axis, wherein the passageways of the jets terminate on a common plane generally perpendicular to the central axis;

disposing particles in the reaction chamber;

flowing an atmosphere containing a carbonaceous substance through the nozzle and into the reaction chamber;

heating the particles and the carbonaceous substance in the reaction chamber; and raising the temperature within the reaction chamber to a selected decomposition temperature sufficient to cause thermal decomposition of the substance and deposition of the pyrolytic carbon coatings.

2. The process of claim 1 wherein the heating tubes are separated from each other about 1 cm or less.

3. The process of claim 2 wherein adjacent heating tubes touch each other.

4. The process of claim 1 wherein the passageways of the two other jets have a vertex that is along the central axis and remote from the inside of the reaction chamber.

5. The process of claim 1 wherein the nozzle includes a plurality of jets having passageways that circumferentially extend around the central axis and define a conical shape with the central axis.

6. The process of claim 5 wherein the plurality of passageways and the passageways of the two other jets all have a common vertex that intersects the passageway of the central jet.

7. The process of claim 1 further comprising the steps of:

forming a reaction zone inside the reaction chamber;

extending the reaction zone along the central axis from a first point located above the nozzle to a second point located above the first point;

maintaining the decomposition temperature generally constant throughout the reaction zone.

8. The process of claim 7 where the reaction zone extends about 10 cm.

9. The process of claim 8 wherein the step of maintaining the decomposition temperature generally constant further includes allowing the decomposition temperature to vary about 10° C.

10. A process for depositing pyrolitic carbon coatings, comprising the steps of:

providing a fluidized bed reaction chamber having a nozzle at one end of the reaction chamber and a plurality of heating tubes disposed around the reaction chamber;

disposing particles in the reaction chamber;

flowing an atmosphere containing a carbonaceous substance through the nozzle and into the reaction chamber;

heating the particles and the carbonaceous substance in the reaction chamber;

raising the temperature of the particles to a selected decomposition temperature within a reaction zone located inside the reaction chamber;

extending the reaction zone from a first point located above the nozzle to a second point located at least about 10 cm above the first point; and maintaining the decomposition temperature generally constant throughout the reaction zone such that the decomposition temperature varies between the first and second points about 10° C.

* * * * *